US011044837B2

(12) United States Patent
Dong et al.

(10) Patent No.: US 11,044,837 B2
(45) Date of Patent: Jun. 22, 2021

(54) SKYLIGHT OPERATING SYSTEM OF MODULAR DATA CENTER

(71) Applicant: Vertiv Tech Co., Ltd., Guangdong (CN)

(72) Inventors: Longlong Dong, Shenzhen (CN); Xing Li, Shenzhen (CN); Xin Liu, Shenzhen (CN); Cheng Gao, Shenzhen (CN); Peng Nie, Shenzhen (CN); Weiguang Li, Shenzhen (CN)

(73) Assignee: Vertiv Tech Co., Ltd., Shenzhen (CN)

( * ) Notice: Subject to any disclaimer, the term of this patent is extended or adjusted under 35 U.S.C. 154(b) by 0 days.

(21) Appl. No.: 16/067,427

(22) PCT Filed: Jun. 12, 2018

(86) PCT No.: PCT/CN2018/090730
§ 371 (c)(1),
(2) Date: Dec. 20, 2019

(87) PCT Pub. No.: WO2019/184091
PCT Pub. Date: Oct. 3, 2019

(65) Prior Publication Data
US 2020/0154611 A1    May 14, 2020

(30) Foreign Application Priority Data
Mar. 26, 2018  (CN) .......................... 201810252340.1

(51) Int. Cl.
*H05K 7/20* (2006.01)
*E05F 15/608* (2015.01)
(Continued)

(52) U.S. Cl.
CPC ....... *H05K 7/20827* (2013.01); *E05C 19/166* (2013.01); *E05F 15/608* (2015.01);
(Continued)

(58) Field of Classification Search
CPC .......... H05K 7/20827; H05K 7/20781; H05K 7/1495; E05F 15/608; E05F 15/72; E05C 19/166
See application file for complete search history.

(56) References Cited

U.S. PATENT DOCUMENTS 3,516,210 A * 6/1970 Couture .............. E04D 13/0354
52/1
9,572,290 B2 * 2/2017 Chen ...................... H05K 7/202
(Continued)

FOREIGN PATENT DOCUMENTS

CN   105587201    *  5/2016  ............. A62C 37/00
CN   105587201 A     5/2016
(Continued)

OTHER PUBLICATIONS

International Search Report regarding International Application No. PCT/CN2018/090730 dated Jan. 4, 2019. Translation provided by Unitalen Attorneys at Law.

*Primary Examiner* — Mukundbhai G Patel
(74) *Attorney, Agent, or Firm* — Harness, Dickey & Pierce, P.L.C.

(57) ABSTRACT

The present invention discloses a skylight operating system of a modular data center, so as to timely respond to a firefighting requirement of the modular data center to reduce occurrence of firefighting-related accidents. The skylight operating system comprises: an electric skylight; a firefighting environment index monitoring device arranged inside the modular data center; a monitoring and interacting device arranged in a monitoring room outside the modular data center, and connected with the electric skylight and the firefighting environment index monitoring device, the monitoring and interacting device adapted for receiving monitoring information of the firefighting environment index moni-
(Continued)

toring device, and opening the electric skylight upon determination that a firefighting-related issue occurs inside the modular data center.

16 Claims, 5 Drawing Sheets

(51) Int. Cl.
    *E05F 15/72*         (2015.01)
    *E05C 19/16*         (2006.01)
    *H05K 7/14*          (2006.01)

(52) U.S. Cl.
    CPC ........... *E05F 15/72* (2015.01); *H05K 7/1495* (2013.01); *H05K 7/20781* (2013.01)

(56) References Cited

U.S. PATENT DOCUMENTS

| | | | |
|---|---|---|---|
| 2005/0225936 A1* | 10/2005 | Day | H05K 7/20754 361/679.47 |
| 2009/0229194 A1* | 9/2009 | Armillas | H05K 7/1497 52/79.1 |
| 2010/0018138 A1* | 1/2010 | Lundsgaard | E05F 15/619 52/200 |
| 2010/0023085 A1 | 1/2010 | Wu et al. | |
| 2010/0223085 A1 | 9/2010 | Gauthier et al. | |

FOREIGN PATENT DOCUMENTS

| | | |
|---|---|---|
| CN | 107037764 A | 8/2017 |
| WO | WO-2013070104 A1 | 5/2013 |

\* cited by examiner

SKYLIGHT OPERATING SYSTEM OF MODULAR DATA CENTER

CROSS REFERENCE TO RELATED APPLICATIONS

This application is a 371 National Phase of International Application PCT/CN2018/090730, filed on Jun. 12, 2018, which claims the benefit of Chinese Patent Application No. 201810252340.1, filed with State Intellectual Property Office on Mar. 26, 2018, entitled "SKYLIGHT OPERATING SYSTEM OF MODULAR DATA CENTER", which is incorporated herein by reference in its entirety.

TECHNICAL FIELD

The present invention relates to the technical field of data center devices, and particularly to a skylight operating system of a modular data center.

BACKGROUND ART

In construction of modern large-scale data centers, Modular Data Centers (MDCs) have been applied more and more widely. The modular data center integrates sub-systems such as a power supply and distribution system, a cabinet and wiring system, a thermal management system, a monitoring system, a security and defense system and the like to achieve a high degree of integration of these sub-systems, so as to realize decoupling of data center infrastructure construction from computer room environment construction, and thus having advantages of rapid deployment, easy expansion, reliable operation, efficient energy saving and the like.

In construction of the existing modular data centers, an openable skylight design is generally adopted in order to satisfy a firefighting requirement inside the modular data centers. A skylight generally adopts an eccentric design, and is controlled to be opened/closed by an electromagnetic lock. The skylight is closed when the electromagnetic lock is energized. Upon receipt of an external firefighting signal, the electromagnetic lock is de-energized such that the skylight is rotated and opened under the action of eccentric gravity, so as to enable a firefighting gas or liquid to enter the inside of the modular data center, thus achieving a firefighting object.

The inventor of the present application discovered, in the process of implementing the present application, that skylights of the existing modular data centers have deficiencies such as lagged opening, indefinite opening logic, uncontrollable opening angle, lack of opening feedback, insufficient linkage design after opening and the like in the case of occurrence of a firefighting-related issue, thus affecting normal implementation of firefighting.

SUMMARY OF THE INVENTION

An object of an embodiment of the present invention is to provide a skylight operating system of a modular data center, so as to timely respond to a firefighting requirement of the modular data center to reduce occurrence of firefighting-related accidents.

The skylight operating system of a modular data center provided by the embodiment of the present invention comprises:

an electric skylight;

a firefighting environment index monitoring device arranged inside the modular data center; and a monitoring and interacting device arranged in a monitoring room outside the modular data center, and connected with the electric skylight and the firefighting environment index monitoring device, the monitoring and interacting device adapted for receiving monitoring information of the firefighting environment index monitoring device, and opening the electric skylight upon determination that a firefighting-related issue occurs inside the modular data center.

By adopting the skylight operating system according to the embodiment of the present invention, since the firefighting environment index monitoring device performs real-time monitoring on firefighting environment indices inside the modular data center, the electric skylight can be automatically opened when the monitoring and interacting device determines that a firefighting-related issue occurs inside the modular data center. Compared with the prior art, the electric skylight has definite opening logic and thus can be timely opened, so as to avoid the problem of lagged opening, thus reducing occurrence of firefighting-related accidents.

Wherein, an electric passage door may be further arranged inside the modular data center, and wherein, the monitoring and interacting device is further connected with the electric passage door, for opening the electric passage door upon determination that a firefighting-related issue occurs inside the modular data center. Upon determination that a firefighting-related issue occurs inside the modular data center, the electric passage door is controlled to be opened, so as to enable a firefighting gas or liquid to timely enter the inside of the modular data center, thus reducing occurrence of firefighting-related accidents.

Alternatively, the firefighting environment index monitoring device comprises at least two of a very-early-fire detector, a smoke detector, a temperature sensor, a combustible gas detector and a residual current detector.

Preferably, the skylight operating system further comprises: an acousto-optic warning device arranged at an inner top of the modular data center and/or in the monitoring room outside the modular data center, wherein, the monitoring and interacting device is further connected with the acousto-optic warning device, thereby turning on the acousto-optic warning device upon determination that a firefighting-related issue occurs inside the modular data center.

Alternatively, the acousto-optic warning device comprises a tricolor indicator lamp and a tri-audio speaker, combinations of an indicator lamp color and a speaker audio which are not completely identical with each other corresponding to different warning levels.

An operation and maintenance person can timely know the firefighting-related issue inside the data center according to warning indication information of the acousto-optic warning device and thereby perform a judgment and an operation, thus making it advantageous to further increase a firefighting response speed.

Preferably, the skylight operating system further comprises a camera arranged inside the modular data center, wherein, the monitoring and interacting device is further connected with the camera, thereby displaying and outputting a monitoring screen of the camera and a firefighting operation query interface upon determination that a firefighting-related issue occurs inside the modular data center.

The operation and maintenance person can timely know the device condition and the firefighting-related issue inside the modular data center from the monitoring and interacting device and perform related operations under the guide of the firefighting operation query interface, such that the accuracy of the operations is higher, thus making it advantageous to smoothly implement firefighting operations and also greatly ensuring personal security.

Preferably, the electric skylight comprises:

a fixed frame body;

a rotary skylight eccentrically hinged to the fixed frame body;

an electromagnetic lock, comprising an electromagnet arranged on the fixed frame body and an armature arranged on the rotary skylight; and an angle limiter, detachably and protrudedly fixed to a top surface edge of the rotary skylight and located at a side of a rotation axis of the rotary skylight which is away from barycenter of the rotary skylight, the angle limiter abutting against a top surface of the fixed frame body after the rotary skylight is rotated by a set angle, the set angle being less than 90 degrees.

During mounting, a suitable pre-opening angle of the electric skylight may be selected according to the space deployment of the modular data center. Specifically, if the space of the modular data center allows the rotary skylight to be opened by 90 degrees at the time of firefighting, it is unnecessary to mount the angle limiter, and after the electromagnetic lock is un-locked, the rotary skylight will be opened by up to 90 degrees under the action of barycenter; and if the space of the modular data center allows the rotary skylight to be opened only by a set angle at the time of firefighting, the angle limiter is mounted to the rotary skylight, so as to limit the rotary skylight to be rotable only by up to the set angle at most. By adopting this design scheme, the opening angle of the electric skylight may be flexibly selected, and has better adaptation to the modular data center.

More preferably, the angle limiter is a nonisosceles trapezoidal angle limiter, the nonisosceles trapezoidal angle limiter being inversely mounted to the top surface edge of the rotary skylight and being adapted for interchangeably mounted at 180 degrees in parallel to the rotary skylight. By adopting this design scheme, the electric skylight has three selectable opening angles during mounting, which may be flexibly selected according to the space of the modular data center.

Preferably, the nonisosceles trapezoidal angle limiter has two base angles of 30 degrees and 60 degrees respectively. The electric skylight has three selectable opening angles of 30 degrees, 60 degrees and 90 degrees during mounting.

Preferably, the electric skylight further comprises a microswitch connected with the monitoring and interacting device, the microswitch being arranged on the fixed frame body and located in an absorption area of the electromagnetic lock or an abutting area against the angle limiter, thereby sending corresponding open/close information of the electric skylight to the monitoring and interacting device when a stress state changes, wherein, the monitoring and interacting device is further adapted for displaying and outputting the open/close information of the electric skylight.

When a firefighting-related issue occurs inside the modular data center, the open/close information of the electric skylight can be timely fed back to the monitoring and interacting device, from which the operation and maintenance person can timely know the firefighting-related issue inside the data center and perform a judgment and an operation, thus making it advantageous to further increase a firefighting response speed.

DETAILED DESCRIPTION OF THE EMBODIMENTS

To timely respond to a firefighting requirement of a modular data center to reduce occurrence of firefighting-related accidents, an embodiment of the present invention provides a skylight operating system of a modular data center. To make the object, the technical solution and the advantages of the present invention more clear, the present invention is further described in detail by way of embodiments below.

Figure 1A:
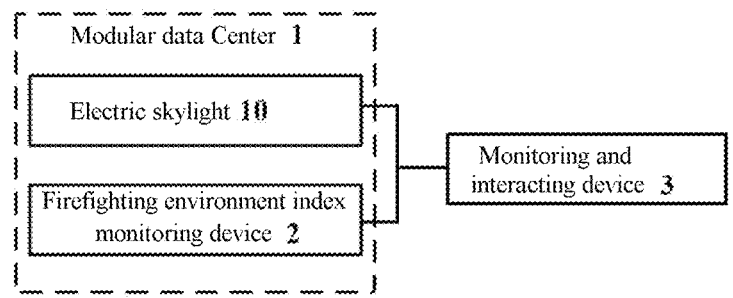
FIG. 1A is a schematic view of a skylight operating system of a modular data center according to one embodiment of the present invention.

As shown in FIG. 1A, a skylight operating system of a modular data center 1 provided by the embodiment of the present invention comprises: an electric skylight 10; a firefighting environment index monitoring device 2 arranged inside the modular data center 1; and a monitoring and interacting device 3 arranged in a monitoring room outside the modular data center 1, and connected with the electric skylight 10 and the firefighting environment index monitoring device 2, the monitoring and interacting device 3 adapted for receiving monitoring information of the firefighting environment index monitoring device 2, and opening the electric skylight 10 upon determination that a firefighting-related issue occurs inside the modular data center 1.

By adopting the skylight operating system according to the embodiment of the present invention, since the firefighting environment index monitoring device 2 performs real-time monitoring on firefighting environment indices inside the modular data center 1, the electric skylight 10 can be automatically opened when the monitoring and interacting device 3 determines that a firefighting-related issue occurs inside the modular data center 1. Compared with the prior art, the electric skylight 10 has definite opening logic and thus can be timely opened, so as to avoid the problem of lagged opening, thus reducing occurrence of firefighting-related accidents.

Figure 1B:
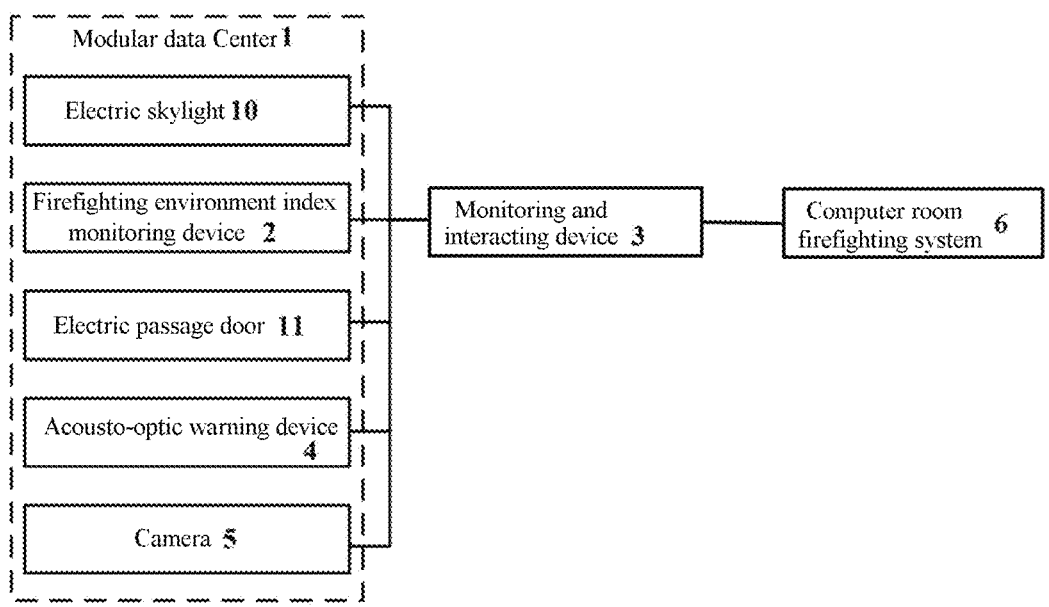
FIG. 1B is a schematic view of a skylight operating system of a modular data center according to another embodiment of the present invention.

The modular data center 1 may comprise several environmental devices such as a thermal management device, a power supply and distribution device, a monitoring device, a security and defense device and the like. As shown in FIG. 1B, an electric passage door 11 may be further arranged inside the modular data center 1, wherein, the monitoring and interacting device 3 is further connected with the electric passage door 11, for opening the electric passage door 11 upon determination that a firefighting-related issue occurs inside the modular data center 1. Upon determination that a firefighting-related issue occurs inside the modular data center 1, the electric passage door 11 is controlled to be opened, so as to enable a firefighting gas or liquid to timely enter the inside of the modular data center, thus reducing occurrence of firefighting-related accidents.

The firefighting environment index monitoring device 2 may comprise a plurality of different types of detection devices, which are adapted for monitoring different firefighting environment indices, respectively. For example, the firefighting environment index monitoring device 2 may comprise at least two of a very-early-fire detector, a smoke detector, a temperature sensor, a combustible gas detector and a residual current detector.

Figure 2:
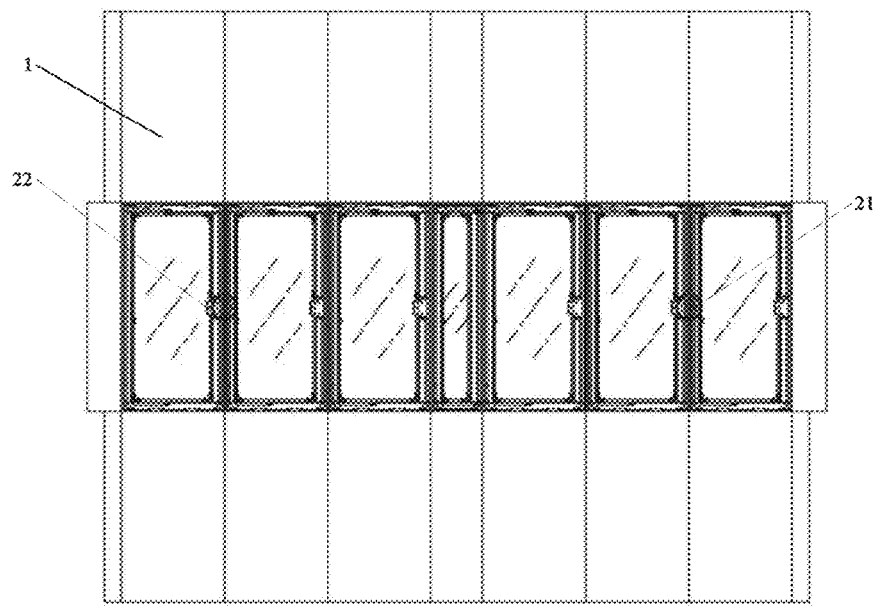
FIG. 2 is a top view of a modular data center having a firefighting environment index monitoring device arranged therein, according to one embodiment of the present invention.
Figure 3:
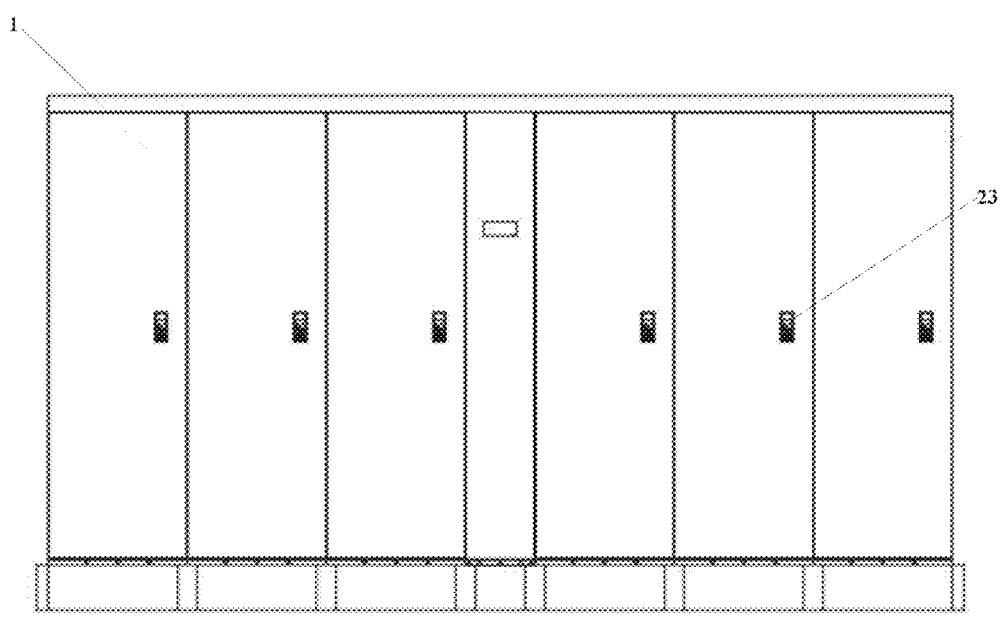
FIG. 3 is a front view of a modular data center having a firefighting environment index monitoring device arranged therein, according to one embodiment of the present invention.

In one embodiment of the present invention, based on different configurations and application scenarios of the modular data center 1, the firefighting environment index monitoring device 2 is configured with at least two different types of detection devices. The detection devices are connected to the monitoring and interacting device 3 in analog quantity form, and corresponding firefighting environment index data inside the modular data center is displayed in real time on a homepage interface of the monitoring and interacting device 3. For example, as shown in FIG. 2 and FIG. 3, a very-early-fire detector 21, a smoke detector 22 and a temperature sensor 23 are arranged for the modular data center 1 in which a battery cupboard is not enqueued; a very-early-fire detector, a smoke detector, a temperature sensor and a combustible gas detector are arranged for the modular data center 1 in which a battery cupboard is enqueued, and for the modular data center in high-density operation, an electric fire detector in residual current type is further configured additionally.

In addition, as shown in FIG. 1B, the skylight operating system may further comprises: an acousto-optic warning device 4 arranged at an inner top of the modular data center 1 and/or in the monitoring room outside the modular data center 1 (not shown), wherein, the monitoring and interacting device 3 further connected with the acousto-optic warning device 4, thereby turning on the acousto-optic warning device 4 upon determination that a firefighting-related issue occurs inside the modular data center 1. Alternatively, the acousto-optic warning device 4 comprises a tricolor indicator lamp and a tri-audio speaker, combinations of an indicator lamp color and a speaker audio which are not completely identical with each other corresponding to different warning levels, wherein the tricolor indicator lamp may be a red indicator lamp, a yellow indicator lamp and a blue indicator lamp. The acousto-optic warning device 4 may be arranged at an inner top of the modular data center 1 and/or inside the monitoring room and be located at a prominent location. An operation and maintenance person can timely know the firefighting-related issue inside the modular data center 1 according to warning indication information of the acousto-optic warning device 4 and thereby perform a judgment and an operation, thus making it advantageous to further increase a firefighting response speed.

Furthermore, the skylight operating system may further comprises a camera 5 arranged inside the modular data center 1, wherein the monitoring and interacting device 3 is further connected with the camera 5, thereby displaying and outputting a monitoring screen of the camera 5 and a firefighting operation query interface upon determination that a firefighting-related issue occurs inside the modular data center 1. The camera 5 may adopt a high-definition infrared IP camera. The operation and maintenance person can timely know the device condition and the firefighting-related issue inside the modular data center 1 from a display interface of the monitoring and interacting device 3 and perform related operations under the guide of the firefighting operation query interface, such that the accuracy of the operations is higher, thus making it advantageous to smoothly implement firefighting operations and also greatly ensuring personal security.

In addition, the monitoring and interacting device 3 may be further connected with a computer room firefighting system 6, to turn on or turn off the skylight operating system upon receipt of a control command about the skylight operating system from the computer room firefighting system 6.

As shown in Table 1, the aforementioned monitoring and interacting device 3 uniformly manages the different types of detection devices, and makes leveled responses with reference to detection results. For example, when the very-early-fire detector operates, a warning page automatically pops up on an interface of the monitoring and interacting device, and the acousto-optic warning device is lighted in blue and makes a first preset sound; when the smoke detector operates, the interface of the monitoring and interacting device is compulsorily switched to a monitoring page of the camera, the electric skylight is opened, the electric passage door is opened, and the acousto-optic warning device is lighted in yellow and makes a second preset sound; when at least two temperature sensors detect that a temperature inside the modular data center is higher than 54° C., an operation query of a refrigeration device and a power supply device pops up on the interface of the monitoring and interacting device, and shortcut access menus for setting the refrigeration device and electric device are displayed on the monitoring page, and the acousto-optic warning device is lighted in red and makes a third preset sound. Warning levels are divided into three levels, i.e., general warning, important warning and emergent warning; a warning in a higher level simultaneously has all the linkage functions of a warning in a lower level.

It is worth mentioning that some entity or virtual buttons for directly controlling the device inside the modular data center may be arranged on the aforementioned monitoring and interacting device 3, the operation and maintenance person may also directly input a control command according to a human judgment, and the device comprises the environment device, the electric skylight, the electric passage door and the like. In addition, as supplementations, a resettable button located on an upright column of the electric passage door, a virtual button for turning on the skylight operating system which is located on the interface of the monitoring and interacting device, and a control command issued by the computer room firefighting system may also directly trigger the skylight operating system to be turned on, and link to an operation of the acousto-optic warning device.

TABLE 1

Linkage Table of Skylight Operating System

| Detector Type | Warning Level | Tricolor Acousto-optic Warning Device | Linkage Operation of Skylight Operation System |
|---|---|---|---|
| Very-early-fire Detector | General Warning | Blue + First Preset Sound | a warning at the bottom of the monitoring interface |
| Smoke Detector | Important Warning | Yellow + Second Preset Sound | the skylight is opened, the passage door is opened; the monitoring interface is compulsorily switched to the camera monitoring screen |
| Temperature Sensor | Emergent Warning | Red + Third Preset Sound | a refrigeration and power distribution control query pops up on the monitoring interface |
| Combustible Gas Detector | General Warning | Blue + First Preset Sound | a warning at the bottom of the monitoring interface |
|  | Important Warning | Yellow + Second Preset Sound | the skylight is opened, the passage door is opened |
| Residual Current Detector | Emergent Wanting | Red + Third Preset Sound | a refrigeration and power distribution control query on the monitoring interface |

Figure 4:
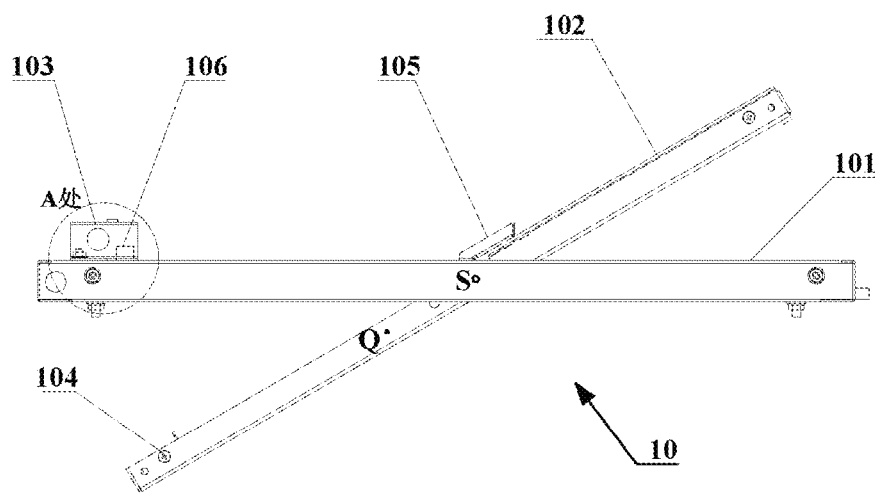
FIG. 4 is a main view (open state) of an electric skylight in one embodiment of the present invention.
Figure 5:
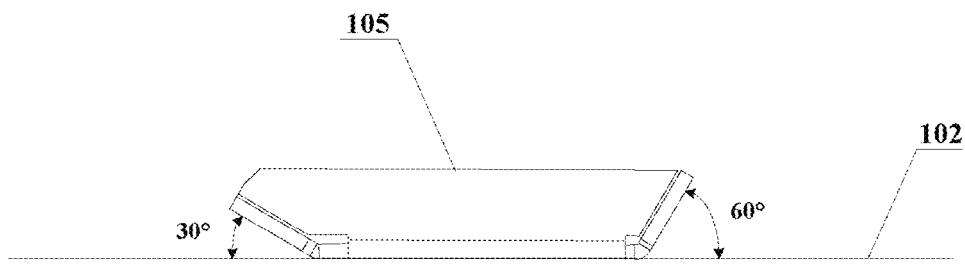
FIG. 5 is a schematic view of an angle limiter of an electric skylight in one embodiment of the present invention.

As shown in FIG. 4 and FIG. 5, in a preferable embodiment of the present invention, the electric skylight 10 comprises: a fixed frame body 101; a rotary skylight 102 eccentrically hinged to the fixed frame body 101; an electromagnetic lock, comprising an electromagnet 103 arranged on the fixed frame body 101 and an armature 104 arranged on the rotary skylight 102; and an angle limiter 105, detachably and protrudedly fixed to a top surface edge of the rotary skylight 102 and located at a side of a rotation axis S of the rotary skylight 102 which is away from barycenter Q of the rotary skylight 102, the angle limiter 105 abutting against a top surface of the fixed frame body 101 after the rotary skylight 102 is rotated by a set angle, the set angle being less than 90 degrees.

During mounting, a suitable pre-opening angle of the electric skylight 10 may be selected according to the space deployment of the modular data center. Specifically, if the space of the modular data center allows the rotary skylight 102 to be opened by 90 degrees at the time of firefighting, it is unnecessary to mount the angle limiter 105, and after the electromagnetic lock is un-locked, the rotary skylight 102 which is eccentrically mounted will be opened by up to 90 degrees under the action of barycenter; and if the space of the modular data center allows the rotary skylight 102 to be opened only by a set angle at the time of firefighting, the angle limiter 105 is mounted to the rotary skylight 102, so as to limit the rotary skylight 102 to be rotable only by up to the set angle at most. By adopting this design scheme, the opening angle of the electric skylight 10 may be flexibly selected, and has better adaptation to the modular data center.

The specific structure form of the angle limiter 105 is not limited, for example may be a triangular angle limiter. One of side surfaces of the triangular angle limiter serves as a limit surface abutting against the top surface of the fixed frame body 101, so as to limit the opening angle of the rotary skylight 102.

More preferably, the angle limiter 105 is a nonisosceles trapezoidal angle limiter, the nonisosceles trapezoidal angle limiter being inversely mounted to the top surface edge of the rotary skylight 102 and being interchangeably mounted in directions of 0 degree and 180 degrees in parallel to the rotary skylight 102. By adopting this design scheme, the electric skylight 102 has three selectable opening angles during mounting, which may be selected flexibly according to the space of the modular data center. Two base angles of the nonisosceles trapezoidal angle limiter can be designed correspondingly according to a designed opening angle of the electric skylight 102. For example, in one alternative embodiment, the nonisosceles trapezoidal angle limiter has two base angles of 30 degrees and 60 degrees respectively. The electric skylight 102 has three selectable opening angles of 30 degrees, 60 degrees and 90 degrees during mounting, exhibiting a great selection flexibility.

As shown in FIG. 4 and FIG. 6 to FIG. 8, the electric skylight 10 further comprises a microswitch 106 connected with the aforementioned monitoring and interacting device 3, the microswitch 106 being arranged on the fixed frame body 101 and located in an absorption area of the electromagnetic lock or an abutting area against the angle limiter 105, thereby sending corresponding open/close information of the electric skylight to the aforementioned monitoring and interacting device 3 when a stress state changes. The aforementioned monitoring and interacting device 3 is further adapted for displaying and outputting the open/close information of the electric skylight.

Figure 6:
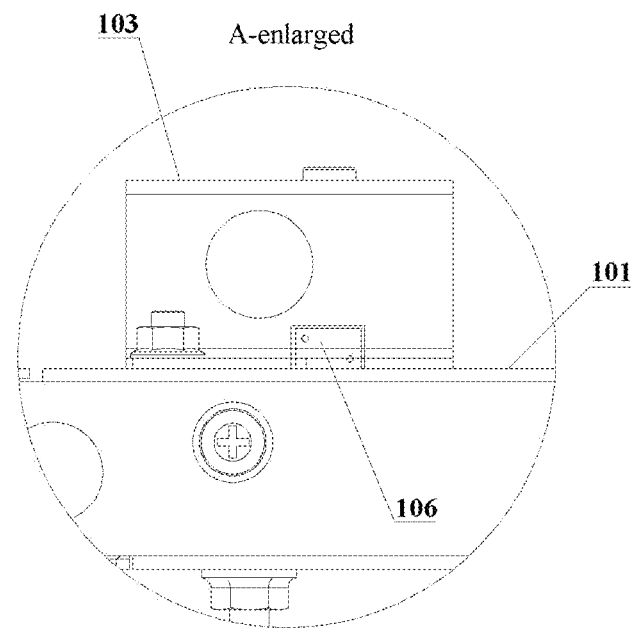
FIG. 6 is an A-enlarged view of FIG. 4.

For example, as shown in FIG. 4 and FIG. 6, the microswitch 106 is arranged on the fixed frame body 101 and is located in an absorption area of the electromagnetic lock, when the electric skylight 10 is in a closed state, the microswitch 106 suffers from a press and thereby sends close information of the electric skylight to the aforementioned monitoring and interacting device 3; and when the electric skylight 10 is opened, the press upon the microswitch 106 is released, and thereby the microswitch 106 sends open information of the electric skylight to the monitoring and interacting device 3.

Figure 7:
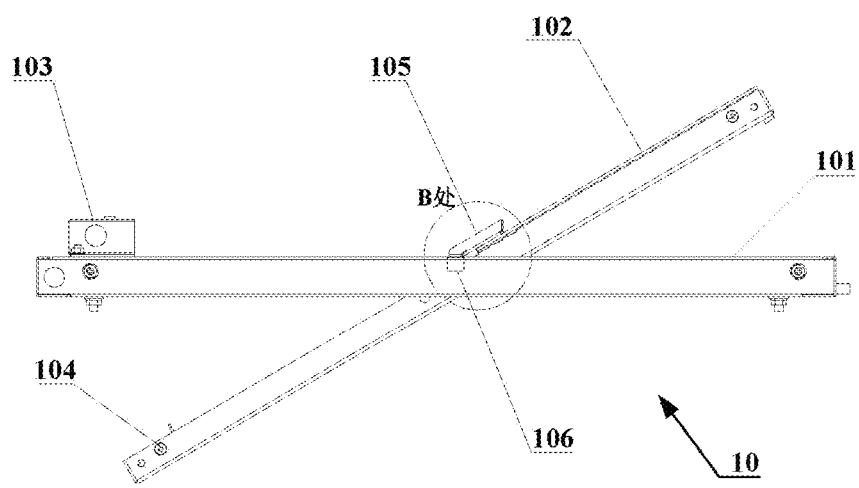
FIG. 7 is a main view (open state) of an electric skylight according to another embodiment of the present invention.
Figure 8:
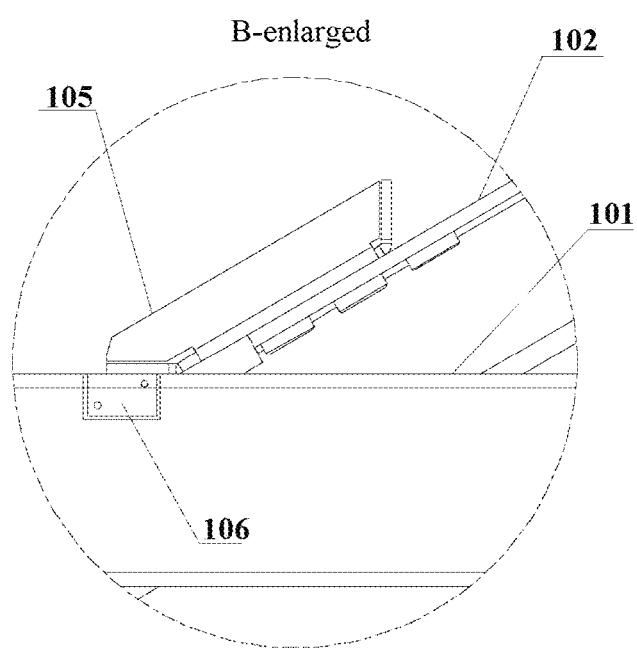
FIG. 8 is a B-enlarged view of FIG. 7.

For example, as shown in FIG. 7 and FIG. 8, the microswitch 106 is arranged on the fixed frame body 101 and is located in an abutting area of the fixed frame body 101 against the angle limiter 105, when the electric skylight 10 is in a closed state, the microswitch 106 does not suffer from a press and thereby sends close information of the electric skylight to the aforementioned monitoring and interacting device 3; and when the electric skylight 10 is opened, the microswitch 106 is pressed by the angle limiter and thereby sends open information of the electric skylight to the monitoring and interacting device 3.

When a firefighting-related issue occurs inside the modular data center, the open/close information of the electric skylight 10 can be timely fed back to a screen interface of the monitoring and interacting device, from which the operation and maintenance person can timely know the firefighting-related issue inside the data center and perform a judgment and an operation, thus making it advantageous to further increase a firefighting response speed.

Obviously, those skilled in the art can make alterations and modifications on the present invention without departing from the spirit and scope of the present invention. Accordingly, provided that these alterations and modifications on the present invention fall within the scope of the claims of the present invention and equivalent techniques thereof, the present invention is also intended to include these alterations and modifications therein.

The invention claimed is:

1. A skylight operating system of a modular data center, comprising:
   an electric skylight;
   a firefighting environment index monitoring device arranged inside the modular data center; and
   a monitoring and interacting device arranged in a monitoring room outside the modular data center, and connected with the electric skylight and the firefighting environment index monitoring device, the monitoring and interacting device being adapted for receiving monitoring information of the firefighting environment index monitoring device, and opening the electric skylight upon determination that a firefighting-related issue occurs inside the modular data center.

2. The skylight operating system according to claim 1, wherein an electric passage door is arranged inside the modular data center, wherein the monitoring and interacting device is further connected with the electric passage door, for opening the electric passage door upon determination that a firefighting-related issue occurs inside the modular data center.

3. The skylight operating system according to claim 2, wherein the electric skylight comprises:
   a fixed frame body;
   a rotary skylight eccentrically hinged to the fixed frame body;
   an electromagnetic lock, comprising an electromagnet arranged on the fixed frame body and an armature arranged on the rotary skylight; and
   an angle limiter, detachably and protrudedly fixed to a top surface edge of the rotary skylight and located at a side of a rotation axis of the rotary skylight which is away from barycenter of the rotary skylight, the angle limiter abutting against a top surface of the fixed frame body after the rotary skylight is rotated by a set angle, the set angle being less than 90 degrees.

4. The skylight operating system according to claim 2, wherein a entity or virtual button for directly controlling a device inside the modular data center is arranged on the monitoring and interacting device.

5. The skylight operating system according to claim 1, wherein the firefighting environment index monitoring device comprises at least two of a very-early-fire detector, a smoke detector, a temperature sensor, a combustible gas detector and a residual current detector.

6. The skylight operating system according to claim 5, wherein the electric skylight comprises:
   a fixed frame body;
   a rotary skylight eccentrically hinged to the fixed frame body;
   an electromagnetic lock, comprising an electromagnet arranged on the fixed frame body and an armature arranged on the rotary skylight; and
   an angle limiter, detachably and protrudedly fixed to a top surface edge of the rotary skylight and located at a side of a rotation axis of the rotary skylight which is away from barycenter of the rotary skylight, the angle limiter abutting against a top surface of the fixed frame body after the rotary skylight is rotated by a set angle, the set angle being less than 90 degrees.

7. The skylight operating system according to claim 1, wherein the skylight operating further comprises:
   an acousto-optic warning device arranged at an inner top of the modular data center and/or in the monitoring room outside the modular data center,
   wherein the monitoring and interacting device further is connected with the acousto-optic warning device, thereby turning on the acousto-optic warning device upon determination that a firefighting-related issue occurs inside the modular data center.

8. The skylight operating system according to claim 7, wherein the acousto-optic warning device comprises a tri-color indicator lamp and a tri-audio speaker, combinations of an indicator lamp color and a speaker audio which are not completely identical with each other corresponding to different warning levels.

9. The skylight operating system according to claim 8, wherein the electric skylight comprises:
   a fixed frame body;
   a rotary skylight eccentrically hinged to the fixed frame body;
   an electromagnetic lock, comprising an electromagnet arranged on the fixed frame body and an armature arranged on the rotary skylight; and
   an angle limiter, detachably and protrudedly fixed to a top surface edge of the rotary skylight and located at a side of a rotation axis of the rotary skylight which is away from barycenter of the rotary skylight, the angle limiter abutting against a top surface of the fixed frame body after the rotary skylight is rotated by a set angle, the set angle being less than 90 degrees.

10. The skylight operating system according to claim 1, wherein the skylight operating system further comprises a camera arranged inside the modular data center,
    wherein the monitoring and interacting device is further connected with the camera, thereby displaying and outputting a monitoring screen of the camera and a firefighting operation query interface upon determination that a firefighting-related issue occurs inside the modular data center.

11. The skylight operating system according to claim 1, wherein the electric skylight comprises:
    a fixed frame body;
    a rotary skylight eccentrically hinged to the fixed frame body;
    an electromagnetic lock, comprising an electromagnet arranged on the fixed frame body and an armature arranged on the rotary skylight; and
    an angle limiter, detachably and protrudedly fixed to a top surface edge of the rotary skylight and located at a side of a rotation axis of the rotary skylight which is away from barycenter of the rotary skylight, the angle limiter abutting against a top surface of the fixed frame body after the rotary skylight is rotated by a set angle, the set angle being less than 90 degrees.

12. The skylight operating system according to claim 11, wherein the angle limiter is a nonisosceles trapezoidal angle limiter, the nonisosceles trapezoidal angle limiter being inversely mounted to the top surface edge of the rotary skylight and being adapted for interchangeably mounted at 180 degrees in parallel to the rotary skylight.

13. The skylight operating system according to claim 12, wherein the nonisosceles trapezoidal angle limiter has two base angles of 30 degrees and 60 degrees respectively.

14. The skylight operating system according to claim 11, wherein the electric skylight further comprises a microswitch connected with the monitoring and interacting device, the microswitch being arranged on the fixed frame body and located in an absorption area of the electromagnetic lock or an abutting area against the angle limiter, thereby sending corresponding open/close information of the electric skylight to the monitoring and interacting device when a stress state changes, wherein the monitoring and interacting device is further adapted for displaying and outputting the open/close information of the electric skylight.

15. The skylight operating system according to claim 1, wherein a entity or virtual button for directly controlling a device inside the modular data center is arranged on the monitoring and interacting device.

16. The skylight operating system according to claim 15, wherein the device comprises the firefighting environment index monitoring device, the electric skylight and the electric passage door.

* * * * *